(12) United States Patent
Jayadeva

(10) Patent No.: US 6,667,706 B2
(45) Date of Patent: Dec. 23, 2003

(54) ANALOG TO DIGITAL CONVERTER

(75) Inventor: Jayadeva, New Delhi (IN)

(73) Assignee: Indian Institute of Technology IITD, New Delhi (IN)

(*) Notice: Subject to any disclaimer, the term of this patent is extended or adjusted under 35 U.S.C. 154(b) by 0 days.

(21) Appl. No.: 10/201,590

(22) Filed: Jul. 22, 2002

(65) Prior Publication Data

US 2003/0058149 A1 Mar. 27, 2003

Related U.S. Application Data

(63) Continuation-in-part of application No. PCT/IN01/00208, filed on Nov. 21, 2001.

(30) Foreign Application Priority Data

Nov. 23, 2000 (IN) .................................. 1047/DEL/2000
Nov. 23, 2000 (IN) .................................. 1046/DEL/2000

(51) Int. Cl.$^7$ .............................................. H03M 1/12
(52) U.S. Cl. ..................................................... 341/156
(58) Field of Search ................................. 341/156, 157, 341/158, 159

(56) References Cited

U.S. PATENT DOCUMENTS

| | | | |
|---|---|---|---|
| 4,291,300 A | 9/1981 | Bader | 340/347 AD |
| 5,644,308 A | 7/1997 | Kerth et al. | 341/120 |
| 5,659,315 A | 8/1997 | Mandl | 341/143 |

*Primary Examiner*—Brian Young
(74) *Attorney, Agent, or Firm*—Ladas & Parry

(57) ABSTRACT

The invention relates to an analog to digital converter computing all the bits in parallel or sequentially, without using decoding logic having an analog input and a digital output, wherein given the analog signal x, each bit can be computed by applying a formula containing a non linear periodic function which may be sine shaped or pulse shaped.

7 Claims, 10 Drawing Sheets

(a)

(b)

ANALOG TO DIGITAL CONVERTER

This application is a continuation-in-part of PCT/IN01/00208, filed Nov. 21, 2001.

The subject invention relates to an analog to digital converter, computing all the bits in parallel and simultaneously without using any decoding logic.

The object of the subject application is to develop a system to be applied on different kinds of implementations offering different degrees of tradeoff between speed and hardware requirement.

BACKGROUND OF THE INVENTION

Signals in the real world are real-valued, or analog in nature, as the output of a pressure or temperature sensor, the amplitude of a speech signal, etc. For example, the output voltage of a microphone may be 2 millivolts (mV) in response to a certain acoustic signal. Suppose that the output of the microphone ranges from a minimum of 0 mV to a maximum of 8 mV. The output of the microphone under consideration may typically be processed by some form of signal processing system.

Most processing equipment today are digital in nature, and they work with signals which are binary valued. In a digital or binary representation, a signal is represented by a word, which is composed of a finite number of bits.

The number of bits is termed as the word length, henceforth denoted by N. Since each bit in the word is either a 0 or a 1, the number of possible combinations is finite. The maximum number of possible binary numbers with N bits is equal to $2^N$. Since an infinite number of real values exist in a given analog range, the binary or digital representation is necessarily an approximate one.

If the output of the microphone can be represented by 3 bits, these bits are denoted by $V_1$, $V_2$ and $V_3$. The number represented by the 3 bits (in millivolts) is given by $V_1+2V_2+4V_3$. In general, with N bits, the digital representation is equal to $$\sum_{i=1}^{N} 2^{i-1} \cdot V_i$$

where the significance of $V_N$ is the highest (it is weighted by $2^{N-1}$; this bit is termed as the Most Significant Bit (MSB). Conversely, $V_1$ is termed as the Least Significant Bit (LSB).

The problem of analog-to-digital conversion is that of finding an N-bit binary word which best approximates a given analog value x, where N is an integer. An Analog to Digital Converter (ADC) for N bits has N output bits labeled $V_1$ to $V_N$, where each $V_i$, (i=1,2, ... N) is either 0 or 1. Given an analog input whose value is denoted by a number x, the ADC is required to determine the values of $V_1$ to $V_N$ such that the error $$\left| x - \sum_{i=1}^{N} 2^{i-1} \cdot V_i \right|$$

is minimized. If N is chosen to be 3, then the following table gives the outputs of a 3-bit ADC for different values of x. The values of x are assumed to lie within the range 0 to 8.

| X | $V_3V_2V_1$ | x | $V_3V_2V_1$ | x | $V_3V_2V_1$ | X | $V_3V_2V_1$ |
|---|---|---|---|---|---|---|---|
| 0 | 000 | 1 | 001 | 1.25 | 001 | 1.4 | 001 |
| 1.7 | 010 | 2 | 010 | 2.2 | 010 | 2.4 | 010 |
| 3 | 011 | 3.1 | 011 | 4 | 100 | 4.4 | 100 |
| 4.9 | 101 | 5 | 101 | 6 | 110 | 6.3 | 110 |
| 6.6 | 110 | 7.2 | 111 | 7.7 | 111 | 8.0 | 111 |

The existing methods of ADC as known conventionally include flash converters, dual-slope, ramp, sigma-delta, successive approximation, etc.

Presently, flash converters are the only known way of obtaining all the output bits in parallel. A N-bit flash converter requires of the order of $2^N$ comparators. Let the input signal range from 0 to R. The range from 0 to R is divided into $2^N$ levels. These comparators each output a 1 or 0 depending on whether the analog input x exceeds or is below the corresponding level. Decoding logic uses these $2^N$ variables to generate the N output bits. The decoding logic is made up of gates. Practical considerations limit the number of inputs (fan-in) and fan-out of each gate. As a result, the delay due to decoding logic increases as $O(N \log_2 N)$ or faster. These considerations limit the word length of a flash converter.

Since all the bits of a flash converter are obtained simultaneously, the time required to generate the output bits once the analog input has been presented is small.

In the case of a flash converter, the hardware grows exponentially with the number of bits; the number of comparators required for a N-bit converter is $2^N$ and additional decoding logic is required.

Improved systems based on the flash converter use fewer comparators, where the number of comparators required can be written as $2^{KN}$, where K is a fraction between 0 and 1. In other words, the rate at which hardware requirements increase still remains an exponential function of N.

Other conventional approaches such as dual-slope and successive approximation methods require considerably less hardware. However, in these methods, the bits cannot be computed in parallel. As a result, the time taken to generate the binary approximation, which is termed as the conversion time, is much higher than for a flash Analog to Digital Converter.

The conversion time is closely related to the sampling rate that can be handled by the Analog to Digital Converter. This is the rate at which input samples can be accepted. Obviously, the next sample cannot be taken up by the ADC until the previous one has been converted.

In an other conventional frequency domain approach called sigma-delta conversion, the input signal is sampled at a high rate to achieve an analog to digital conversion. The scheme requires the extensive use of filters and additional hardware. An additional drawback is the need for the circuitry to work at a high speed, typically much higher than the sampling rate. This also creates hurdles with regard to hardware or circuit realization of such methods.

PRIOR ART

One approach to reducing the circuitry is known as a folding/interpolating type converter. As prior art of such a folding-interpolating ADC (FADC), there is, for example, that which is disclosed as U.S. Pat. No. 6,236,348 B1. In a folding/interpolating ADC, the input analog signal is converted into a set of n1 higher order bits and n2 lower order bits, where n1+n2=N. The idea in such a converter is to divide the range of the signal into segments. The higher order bits are obtained by determining the segment in which the value of a given input sample lies, while the n2 lower order bits are obtained by using $2^{n2}$ comparators and a suitable encoder.

Mandl, in patent U.S. Pat. No. 5,659,315, teaches us a method of accomplishing oversampled sigma-delta analog to digital conversion. The sampled analog signal is first converted using a ADC with a lower resolution. The conversion error is determined by obtaining the difference between the value of the digital word and the input sample. The error is fed to an integrator and again converted by using the ADC with a smaller resolution. In this manner, in succcessive steps, the quantization error reduces. In the limit, the smaller resolution ADC can be thought of as a one-bit ADC, which is no more than a comparator. Such a comparator compares a given input with a reference signal and outputs a "1" if the input exceeds the reference, and outputs a "0" if the input is less than the reference signal.

A variety of designs based on delta modulation have also been reported. Bader, in patent U.S. Pat. No. 4,291,300, teaches us a method of converting a time-varying (AC) signal which is superimposed on a larger, fixed (DC) component. It is concerned with tracking the time-varying part of the signal and its conversion, which is accomplished by means of a capacitive storage and by incremental variation of a reference signal. The variation of the reference signal is achieved by a series of clock pulses.

Another approach known as an Algorithmic ADC or cyclic ADC employs a very different approach. Kerth, in patent U.S. Pat. No. 5,644,308, discloses a design of an Algorithmic ADC. In an Algorithmic ADC, the conversion is carried out in a sequential manner, by employing the conventional restoring numerical division principle. The input signal sample is multiplied by two and the product is then compared with a reference. If the product exceeds the reference, then the output bit is set to "1" and the reference is subtracted from the product. Otherwise, the output bit is set to "0" and no subtraction is carried out. The remaining part of the product is treated as the signal for computing the next bit. In this manner, the desired number of bits are generated. Algorithmic converters suffer from differential and integral non-linearities, and errors in the gain of the conversion loop. Redundant signed digit (RSD) procedures have been used to overcome such difficulties. A related approach, which is outlined in U.S. Pat. No. 5,644,308 converts the redundant digital code to a digital output signal by computing a polynomial of a radix, where the redundant digital code specifies the co-efficient of the polynomial. This extends the analog input conversion range and reduces errors due to non-linearities.

SUMMARY OF THE INVENTION

In order to overcome the drawbacks associated with the existing methods of analog to digital conversion, the subject application has been devised, where all the bits can be computed in parallel or sequentially without using any decoding logic.

The subject system relates to the computation of all the output bits in parallel or sequentially, where the input x lies between 0 and R. The most significant bit (MSB), i.e $V_{MSB}$ is given by $V_{MSB}=1$ if $x \geq R/2$ $V_{MSB}=0$ if $x < R/2$ Furthermore, $V_{MSB-1}=1$ if $R/4 < x < R/2$ OR if $3R/4 < x < R$ $V_{MSB-1}=0$ if $0 < x < R/4$ OR if $R/2 < x < 3R/4$ The (MSB-i)-th bit denoted by $V_{MSB-i}$ can be computed by using the following formula $V_{MSB-i}=P[x/(R/2^i)]$ where i ranges from 0 (corresponding to the MSB) to N−1 (corresponding to the LSB), where P(z) is a periodic pulse-shaped function of its argument z, having period equal to 1, the value of P(z) being 0 for z being less than 0.5 and 1 for values between 0.5 and 1.

In an another embodiment, the same formula may be written as $V_{MSB-i}=\text{Sign}[-\sin(\pi x/(R/2^{i+1}))]$, where Sign(z) is 1 if the argument z is positive and is 0 otherwise.

The present invention relates to an analog to digital converter computing all the bits in parallel or sequentially without using any decoding means having an analog input and a digital output, comprising a means for sampling the analog input signal and holding the sample values;

a set of N functional blocks, each comprising a combination of non-linear gain blocks realizing periodic functions $-\sin[\pi x/(R/2^{i+1})]$, with i ranging from 0, corresponding to the MSB, to (N−1), corresponding to the LSB, the input to all the N functional blocks being the sampled analog value x, the output of each block feeding a Sign( ) block computing the sign of its input wherein the output of a Sign( ) block is zero if the input is non-positive and one otherwise, the outputs of the Sign( ) blocks representing the output digital word.

According to the present invention, analog to digital converter computing all the bits in parallel or sequentially without using any decoding means having an analog input and a digital output, wherein the digital output is a binary word comprised of the bits which are computed using the formula $$V_{MSB-i}=P[x/(R/2^i)], i=0, 1, 2, \ldots N-1$$

where $V_{MSB}$ denotes the Most Significant Bit, x is the analog input whose magnitude ranges from 0 to R, N is the number of bits in the output digital word, and P is a square wave form with period equal to 1.

The present invention also relates to an analog to digital converter computing all the bits sequentially without using any decoding means having an analog input and a digital output, comprising means for sampling the analog input signal and holding the sample values;

counter block initialized having the initial counter value at 1 counting from 1 to N multiplexer receiving the sample values from sample and holding means, wherein when the counter value is equal to 1, the multiplexer passes the input on line 1 to its output and the multiplexer passes the input on Line 2, to its output, when the counter value is any number other than 1 and the output from multiplexer is fed to a functional block as well as to a delay block (circuit);

delay mechanism connected to the output of multiplexer to delay the signal passed by multiplexer before being doubled;

doubler connected to the delay circuit and multiplexer, doubling the delayed signal to feed the doubled output signal to the multiplexer, wherein the multiplexer passes one of its inputs to the functional block depending upon the counter value;

functional block comprising a combination of non-linear gain blocks realizing formula of $V_{MSB}$.

In another embodiment of the subject invention all the bits may be computed in parallel or sequentially without using any decoding means having an analog input and a digital output, comprising a means for sampling the analog input signal and holding the sample values, a start-of-conversion block, a set of N modules for determining each of the N bits of the digital word output, where N denotes the word length, each module consisting of a Ramp wavefrom generator, a Pulse Generator, a comparator, and a latch, wherein the said sample and holding (S/H) block samples the analog input signal, holds the sample values and receives a trigger signal from the start of conversion block the said start of conversion block holds the sample at the S/H block, and resets the outputs of the ramp generator, pulse generator and latch to zero.

In each module, the Pulse Generator generates a square waveform P(t) with a constant time period T, where T denotes the conversion time, which is fixed depending on the application and the speed at which the converter is required to be operated. The pulse waveform is zero for time 0 to (T/2) and is equal to 1 for time (T/2) to T; then again zero for the next half period and so on.

The Ramp waveform generator generates an output given by $k_i t$, where $k_i$ is the slope of the ramp and t denotes time measured from the arrival of the Start of Conversion (SOC) pulse, and where $k_i$ is given by $[R/(T*2^i)]$ for the (MSB-i)-th bit or module, and where R denotes the range of the input signal x, i.e. x ranges from 0 to R the Comparator generates the end-of-conversion signal when the sampled value and output of the Ramp generator are equal, and feeds a trigger signal to the latch to store and hold the value of the pulse generator when the said condition is true.

The Latch receives and stores the output of the pulse generator when the trigger output from the comparator is at its rising edge, signaling the end, of conversion of the input signal from analog to digital.

The said analog to digital converter comprises a plurality of circuits arranged in parallel for different bits from the most significant bit to least significant bit.

In another embodiment of the subject application, all the circuits generating various bits from the most significant bit to least significant bit may be supplied by a single ramp generator, wherein the input signal to the (MSB-i)th circuit is the analog sample x passed through a multiplier which multiplies it by a factor of $2^i$, i.e. the input to the (MSB-i)th circuit is equal to $(x*2^i)$, and output of the ramp generator is given by (R/T)t, where t denotes time measured from the arrival of the Start of Conversion (SOC) pulse and T denotes the conversion time.

In another embodiment of the subject application, all the circuits generating various bits from the most significant bit to least significant bit may be supplied by a single ramp generator and a single pulse generator, wherein the pulse waveform is a square wave with time period T; the input signal to the (MSB-i)th circuit is the analog sample x passed through a multiplier which multiplies it by a factor of $2^i$, i.e. the input to the (MSB-i)th circuit is equal to $(x*2^i)$, and output of the ramp generator is given by (R/T)t, where t denotes time measured from the arrival of the Start of Conversion (SOC) pulse and T denotes the conversion time.

In another embodiment of the subject application, all the circuits generating various bits from the most significant bit to least significant bit may be supplied by a single ramp generator and a single pulse generator, wherein the pulse waveform is a square wave with time period T; modules being arranged from the one computing the MSB to the one computing the LSB, each module but the last being equipped with a doubler; the input signal to each module being obtained by multiplying the input signal to the previous module by a factor of 2 with the use of doubler, with the MSB module receiving the analog sample x as input. No other multipliers are required in this case and the output of the ramp generator is given by (R/T)t, where t denotes time measured from the arrival of the Start of Conversion (SOC) pulse and T denotes the conversion time.

In another embodiment of the subject application, all the circuits generating various bits from the most significant bit to least significant bit may be supplied by a single ramp generator and a single pulse generator, wherein the pulse waveform is a square wave with time period T; modules being arranged from the one computing the LSB to the one computing the MSB, each module but the last being equipped with a halver or divide-by-two unit, the input signal to each module being obtained by dividing the input signal to the previous module by a factor of 2 with the use of halver, with the LSB module receiving the analog sample x as input. No other multipliers are required in this case and the output of the ramp generator is given by $[R/(2^{N-1}*T)]t$, where t denotes time measured from the arrival of the Start of Conversion (SOC) pulse and T denotes the conversion time.

The subject application may better be understood with reference to the accompanying drawings and various embodiments involved therein. However, the same are for illustrative purposes only and should not be construed to restrict the scope of the invention.

BRIEF DESCRIPTION OF THE ACCOMPANYING DRAWINGS

DETAILED DESCRIPTION OF THE INVENTION

Figure 1:
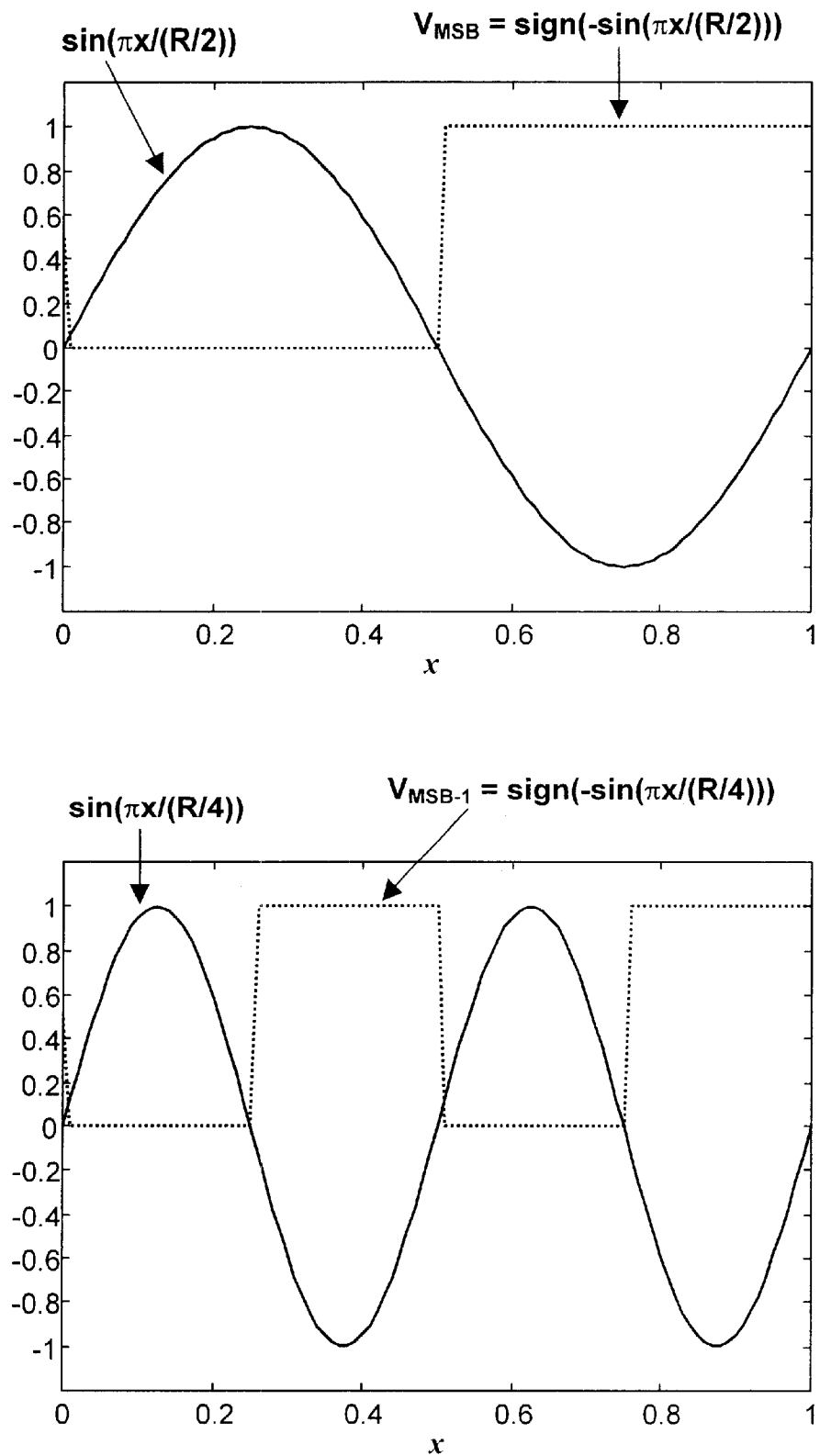
FIG. 1 depicts the computation of $V_{MSB}$ and $V_{MSB-1}$ using the sine function.

The computation of $V_{MSB}$ and $V_{MSB-1}$ in general is depicted in FIG. 1, depicting the formula as $V_{MSB-i}$=Sign $[-\sin(\pi x/(R/2^{i+1}))]$. That is, all the bits may be computed in parallel, where the MSB does not have to be computed before other bits are computed. Computing each bit requires a similar operation, which is the computation of the sin( ) function. The input to the block computing the (MSB-i)$^{th}$ bit is x. The bits may also be computed sequentially.

Figure 2:
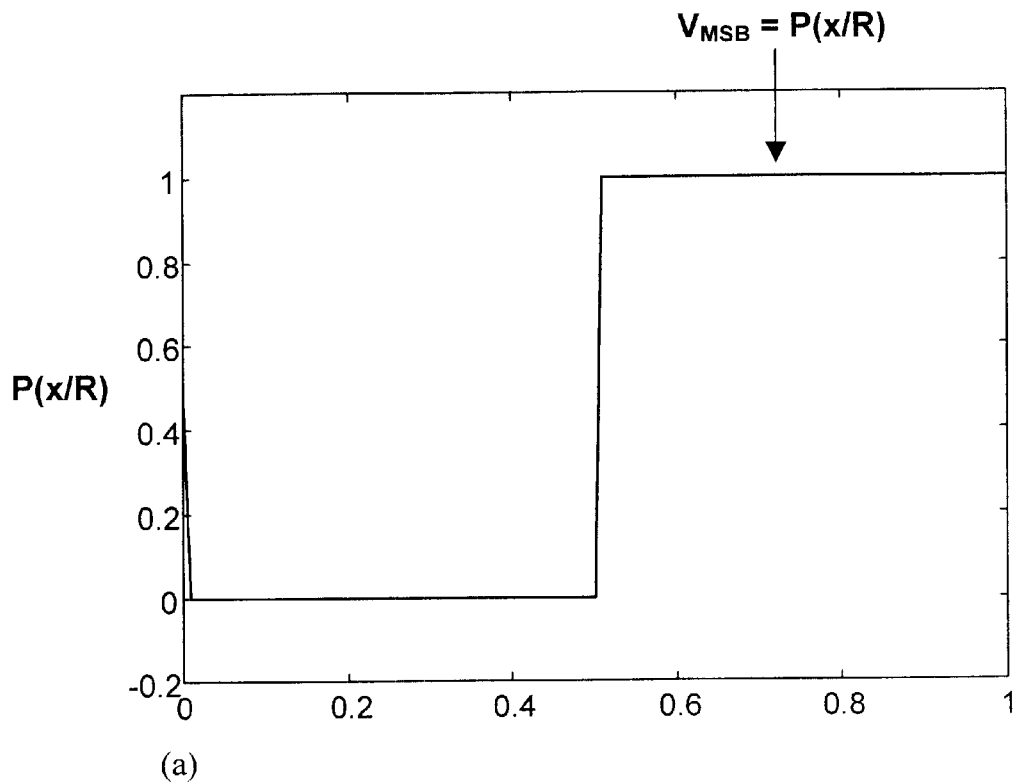
FIG. 2 depicts the computation of $V_{MSB}$ and $V_{MSB-1}$ using pulse-shaped functions.
Figure 2:
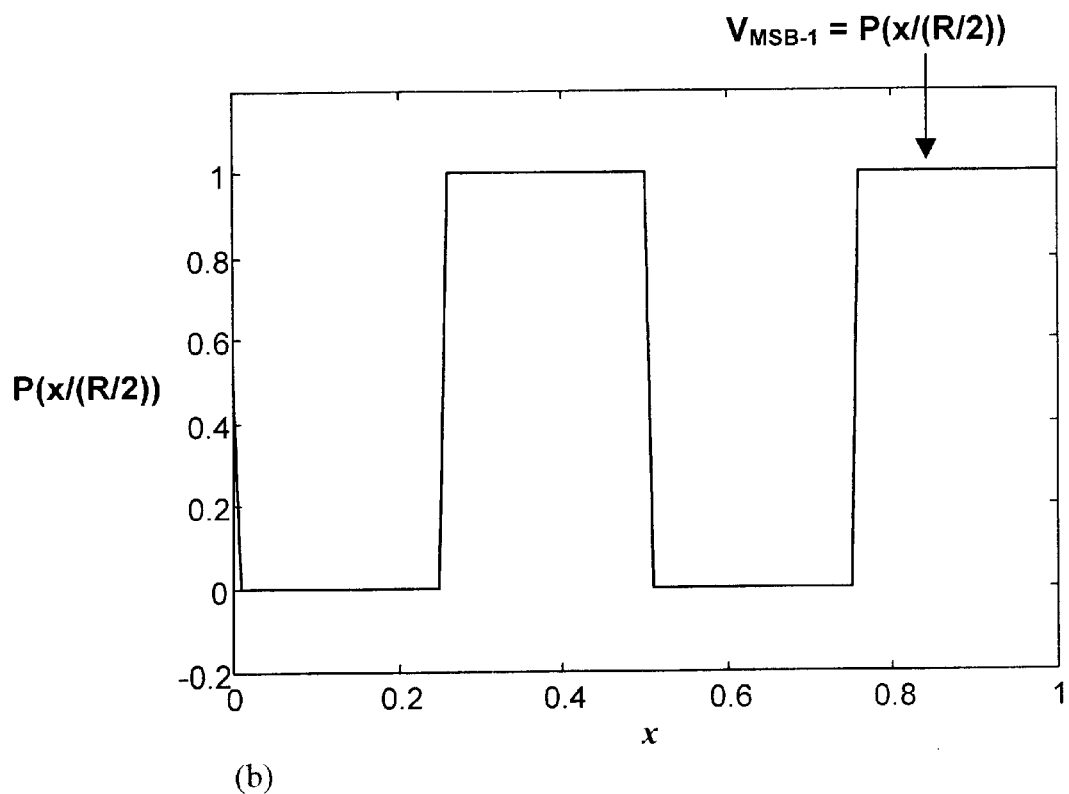

Various alternatives can be obtained by using other periodic functions, as it is not necessary to use the sin( ) function only. The bits may be obtained by using a function of the form $V_{MSB-i}$=P[x/(R/2)$^i$] where P(z) is a periodic pulse shaped function which is periodic with period equal to 1, whose value is zero for the first half period and one for the second half. The functions for determining the MSB and (MSB-1)th bit using such a function are depicted in FIG. 2.

The basic scheme allows for a very simple design and implementation in hardware, where no decoding logic is required as in a flash converter.

Figure 3:
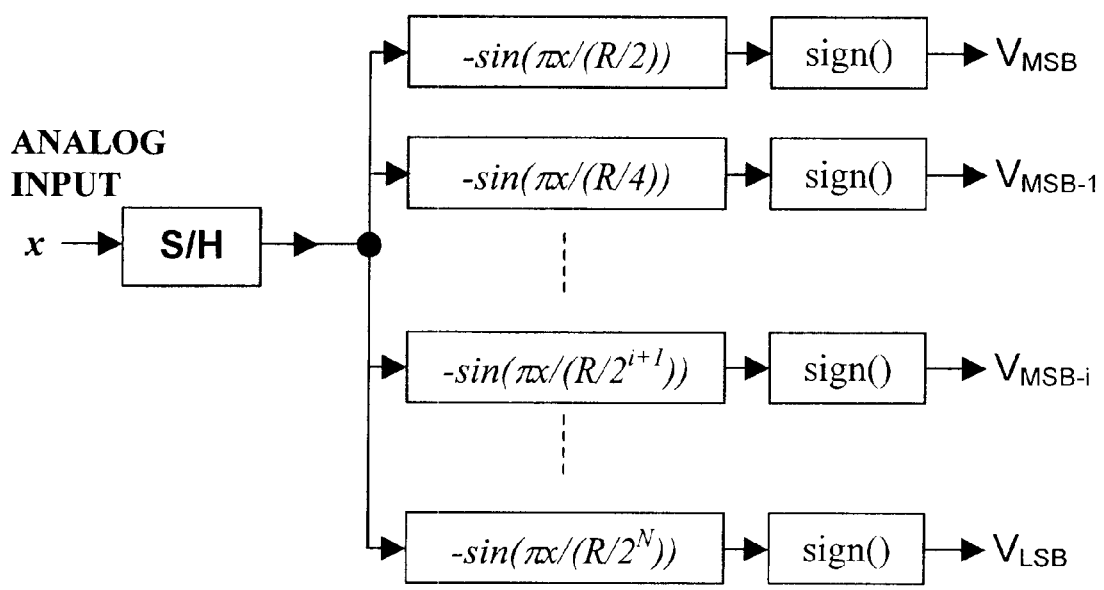
FIG. 3 depicts the schematic of the A/D converter based on the computation of $V_{MSB-i}$ (i=0, 1, 2, . . . N−1) using the sine function.

The conversion may thus be accomplished by designs based on the schematic in FIG. 3, wherein all the bits may be computed in parallel or sequentially without using any decoding means by using means for sampling the analog input signal and holding the sample values;

a set of N functional blocks, each comprising a combination of non-linear gain blocks realizing periodic functions $-\sin[\pi x/(R/2^{i+1})]$, with i ranging from 0, corresponding to the MSB, to (N−1), corresponding to the LSB, the input to all the N functional blocks being the sampled analog value x, the output of each block feeding a Sign( ) block computing the sign of its input wherein the output of a Sign( ) block is zero if the input is non-positive and one otherwise, the outputs of the Sign( ) blocks representing the output digital word.

Figure 4:
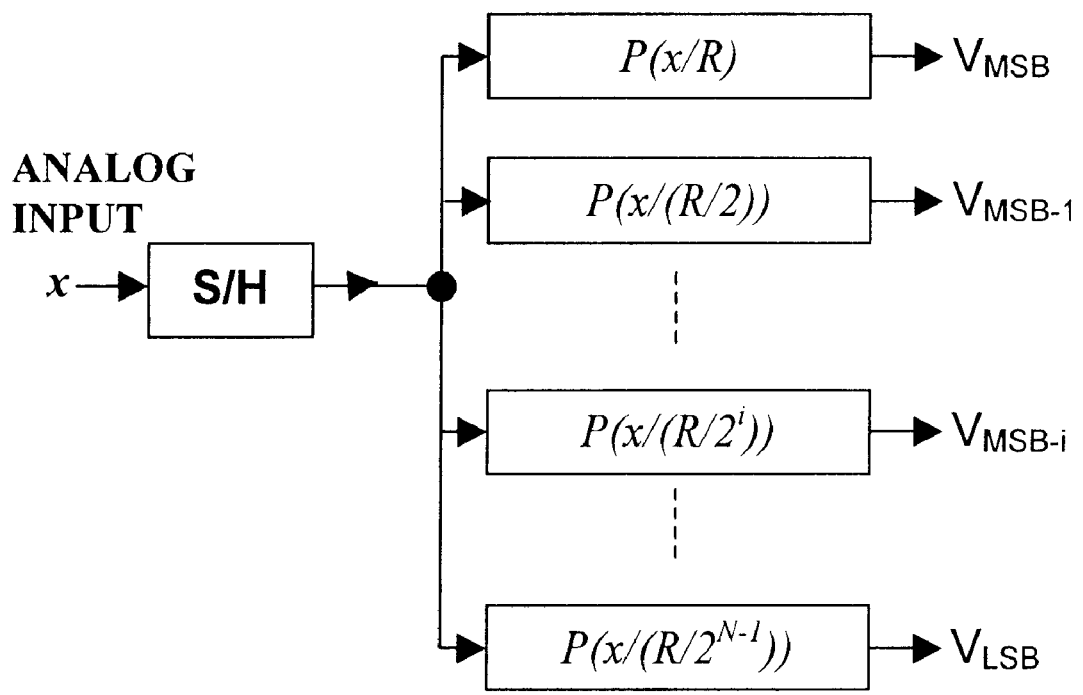
FIG. 4 depicts the schematic of A/D converter based on the computation of $V_{MSB-i}$ (i=0, 1, 2, . . . N−1) using pulse shaped functions.

FIG. 4 depicts an alternative approach which uses means for sampling the analog input signal and holding the sample values;

a set of N functional blocks, each comprising a combination of non-linear gain blocks realizing pulse shaped functions P[x/(R/2$^i$)], with i ranging from 0, corresponding to the MSB, to (N−1), corresponding to the LSB, wherein the function P( ) is a periodic function with a period of 1, which is zero for the first half period and one for the second half; the input to all the N functional blocks being the sampled analog value x, the outputs of the blocks representing the output digital word.

The main advantage of the proposed scheme is that all the bits are computed in parallel. The hardware required is much less than that of a flash converter. No decoding logic is required, as is needed in other known methods used conventionally.

Figure 5:
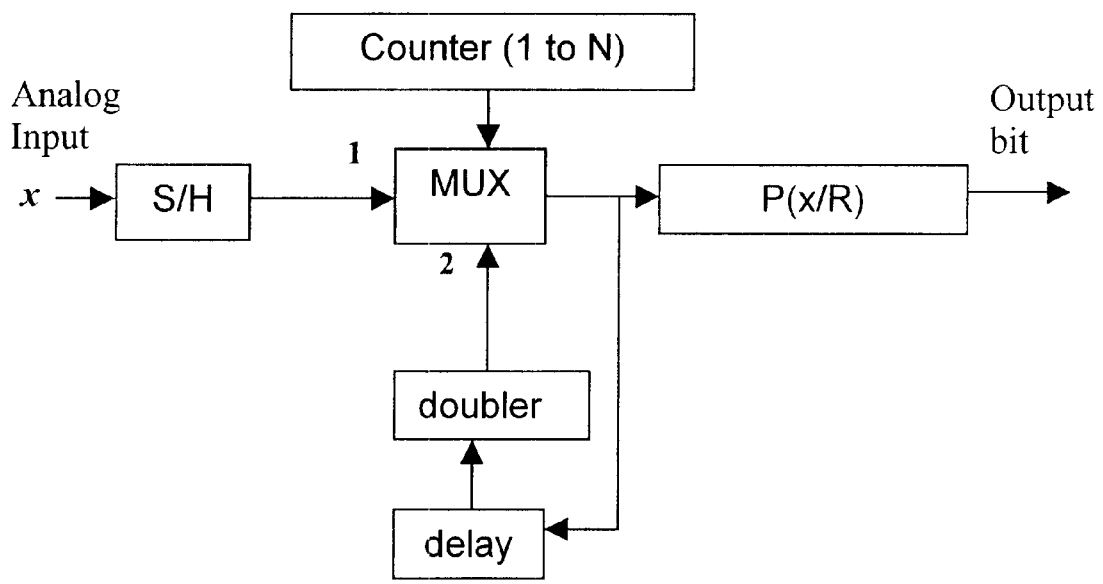
FIG. 5 depicts an implementation using a sample/hold block, a multiplexer, a doubler, a delay, and a nonlinear function block realizing the square wave shaped function P( ).

The various alternative embodiments may be obtained using the same function block, whether a block realizing the P( ) function or the sin( ) one is used. The same function block may be utilized for all bits by introducing a delay and a doubler in a loop as shown in FIG. 5, thus requiring very little hardware.

The input signal x is sampled and the sample values held by a sample-and-hold (S/H) block. Initially, the counter is initialized to 1. When the counter value is equal to 1, the Multiplexer (MUX) passes the input on line 1 to the P( ) block. Therefore, the sample is first passed to the P( ) block as shown in FIG. 5. The output of this block is thus equal to P(x/R), which is the value of the MSB as given by the formula depicted in FIGS. 2 and 4. The sample is passed through a delay element and a doubler and is another input to a Multiplexer (MUX). This input is labeled as line 2. The counter is incremented by 1 after each bit is generated. Whenever the counter value is any number other than 1, the MUX passes the input on line 2 to the P( ) block. When the counter reading is 2, the P( ) block therefore gets the original sample, delayed by one unit delay, and doubled in value. The input to the P( ) block is thus a value 2x, delayed by one delay unit. The output of the P( ) block will now be P[2x/R], which is the same as P[x/(R/2)], which in turn is nothing but the (MSB-1)-th bit as given by the formula. After each successive bit, the P( ) block receives double the previous value as input and generates the next bit. The counter resets to 1 after N counts, i.e. after all bits have been generated.

As the hardware used is very simple, the working of the system is fast. Furthermore, the hardware requirement in the proposed invention does not depend substantially on the number of bits, i.e. a N-bit converter requires one block; the only increase is in the number of bits in the counter, and the time required for conversion to be completed.

Figure 6:
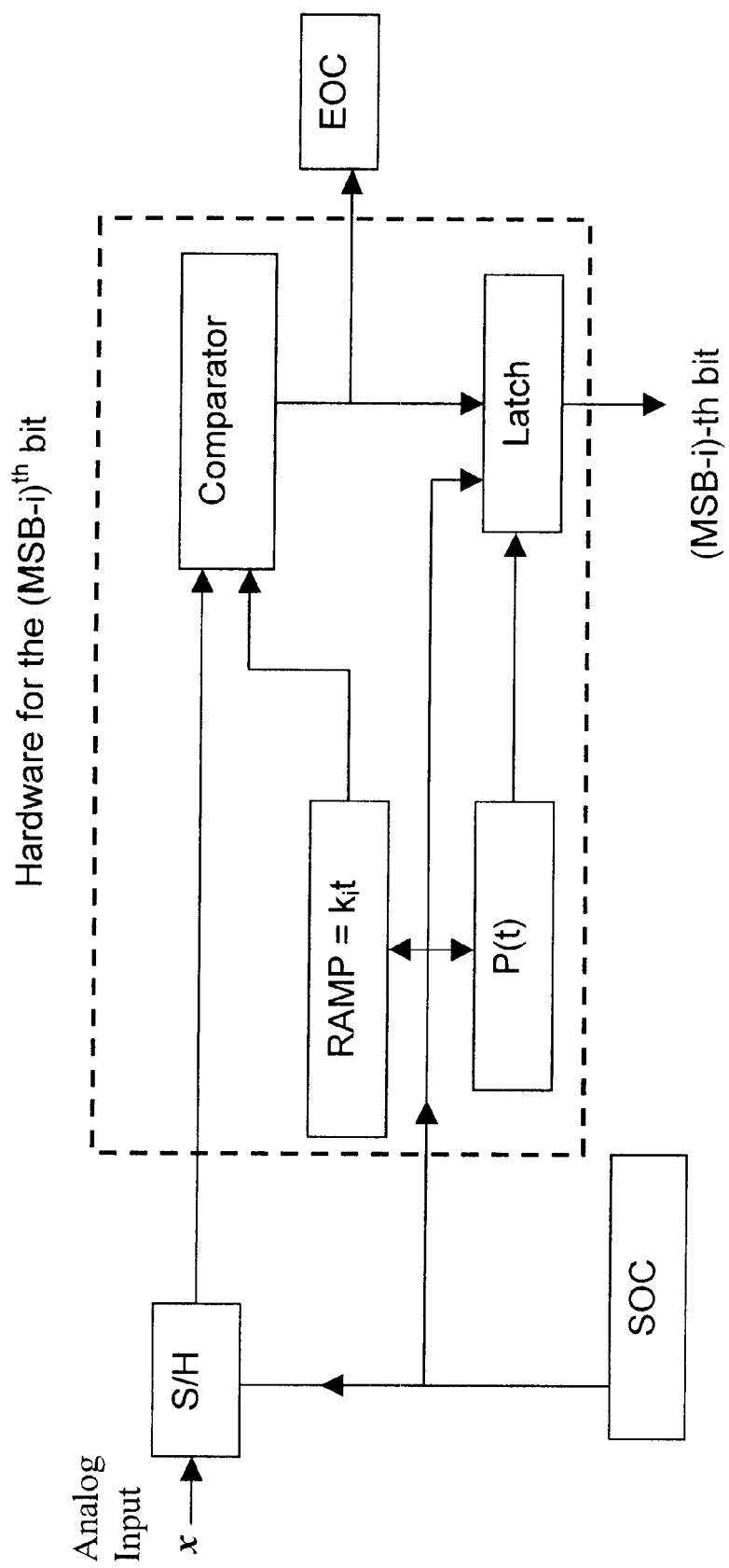
FIG. 6 depicts an implementation using N modules, each module consisting of a ramp generator, a pulse generator, a latch, and a comparator.

FIG. 6 depicts a scheme in which the block enclosed within the dotted rectangle is the circuitry required to compute a single bit. N such modules are arranged for computing the N output bits from the MSB down to the LSB. Each module contains a pulse waveform generator whose output is a periodic function of time, the function being given by the pulse shaped function P(t/T) where T denotes the time period. In other words, the pulse generator generates a square waveform with constant time period T, which is zero during the first half of its period and is equal to 1 during the second half of its time period. Each module also contains a ramp waveform generator whose output is given by $k_i t$, where the value of $k_i$ for the (MSB-i)$^{th}$ bit is equal to [R/(T*2$^i$)] where R denotes the range of the input signal x, and where T is fixed depending on the application and the speed at which the converter is required to be operated.

The circuit operation begins with a start of conversion (SOC) signal as shown in FIG. 6. This holds the sample at the sample and hold block; resets the latch to zero, resets the pulse generator P(t), and resets the ramp generator. The output of the ramp generator begins to increase linearly with time. After a time $t_i$, the value at the output of the ramp generator equals the sampled value x. At this point, the comparator switches from 0 to 1. The output of the comparator is connected to the clock input of the latch. On the rising edge of this input, the latch latches on to store the output of P(t), which at time $t_i$ is equal to P($t_i$). This rising edge of the comparator output also signals the end of conversion (EOC).

The value of $t_i$ is given by $k_i t_i$=x i.e. $t_i$=(x/$k_i$). Hence, the value stored by the latch equals P(x/$k_i$). The value of $k_i$ for the (MSB-i)-th bit is equal to [R/(T*2$^i$)] where R denotes the range of the input signal x, and where T is fixed depending on the application and the speed at which the converter is required to be operated. After the end of conversion signal is generated, the next sample is converted by generating an additional start of conversion signal as shown in FIG. 6.

A comparator compares the outputs of the ramp waveform and the input x. The ramp output is given by a time varying function $k_i t$, where $k_i$ is a constant and t denotes time; t starts from 0. The comparator output changes from 0 to 1 when $k_i t = x$. At this point, the output of the pulse waveform generator is $P(t)=P(x/k_i)=P\{x/[R/(T*2^i)]\}$, which is nothing but the value of the (MSB-i)-th bit given by the formula depicted in FIGS. 2 and 4.

Figure 7:
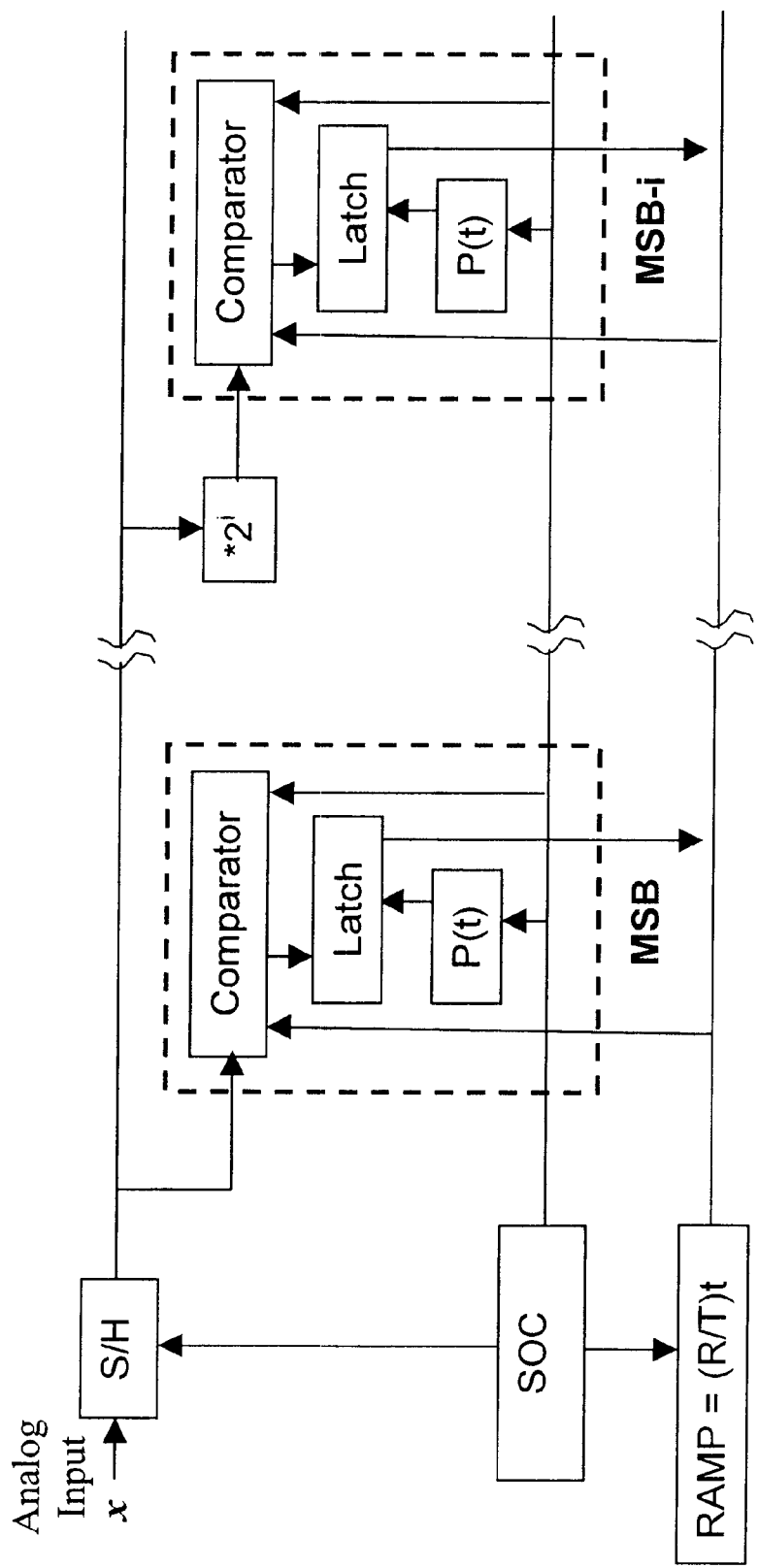
FIG. 7 depicts an alternative implementation using only one ramp generator and N modules, each module consisting of a pulse generator, a latch, a comparator, and a multiplier.

In an another embodiment, a single ramp generator is used to feed blocks corresponding to various bits as shown in FIG. 7. All blocks get a ramp input $(R/T)t$. The input to the block computing the (MSB-i)-th bit is $2^i*x$, which requires the use of a multiplier to scale the analog sample x by a factor of $2^i$. The comparator in the (MSB-i)-th block switches at a time $t_i$, where $(R/T)t_i=2^i* x$, i.e. $t_i=x/[R/(2^i*T)]$. $P(t_i)$ is thus equal to $P\{x/[R/(2^i*T)]\}$, which is nothing but the value of the (MSB-i)-th bit given by the formula depicted in FIGS. 2 and 4. This value is held on to by the latch in the (MSB-i)-th bit block.

Figure 8:
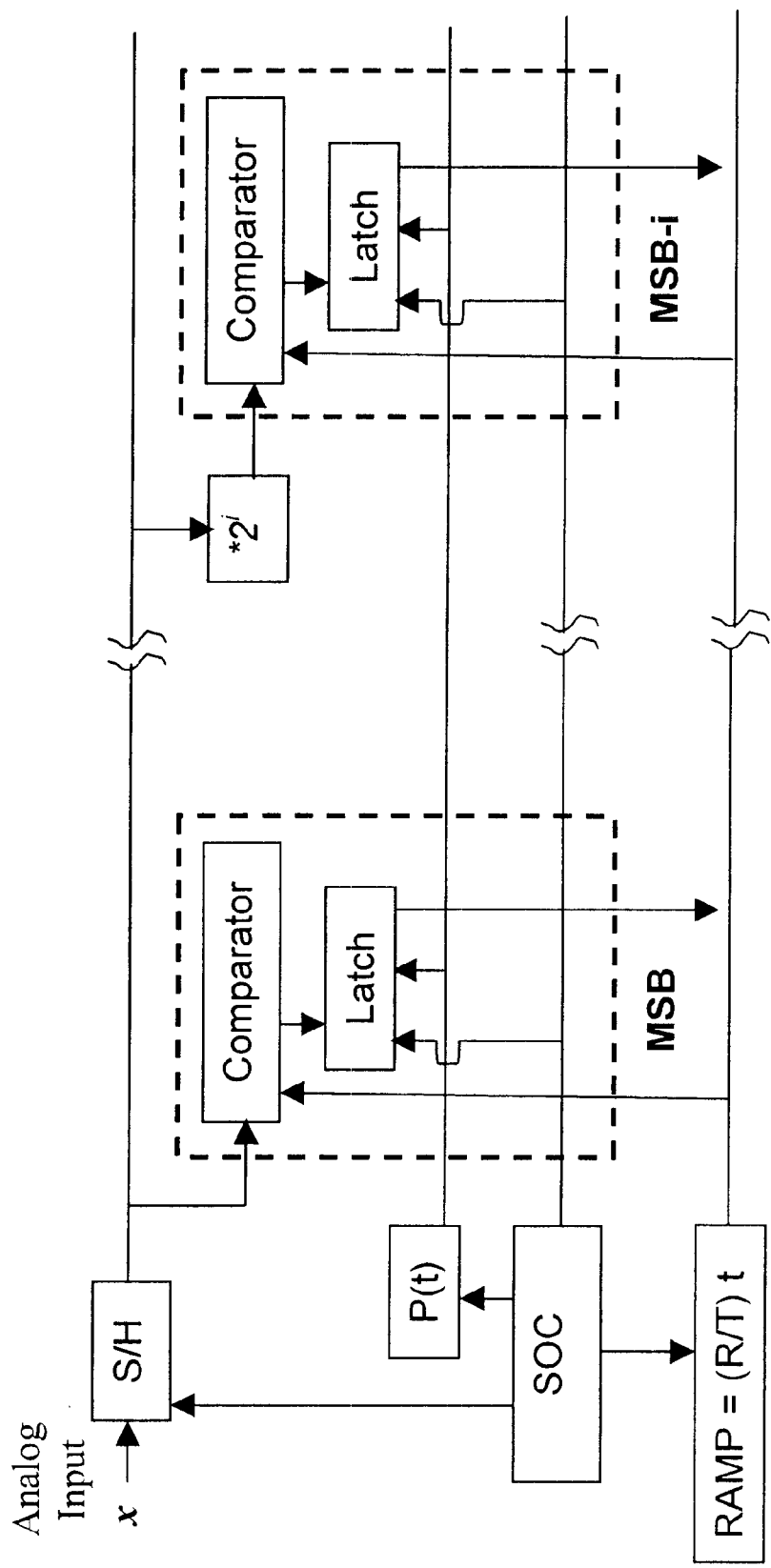
FIG. 8 depicts another alternative implementation using only one ramp generator, one pulse generator, and N modules, each module consisting of a latch, a comparator, and a multiplier.

In yet another embodiment, the hardware used in the subject application may be reduced still further so that only a single pulse generator P(t) is used, as shown in FIG. 8.

Figure 9:
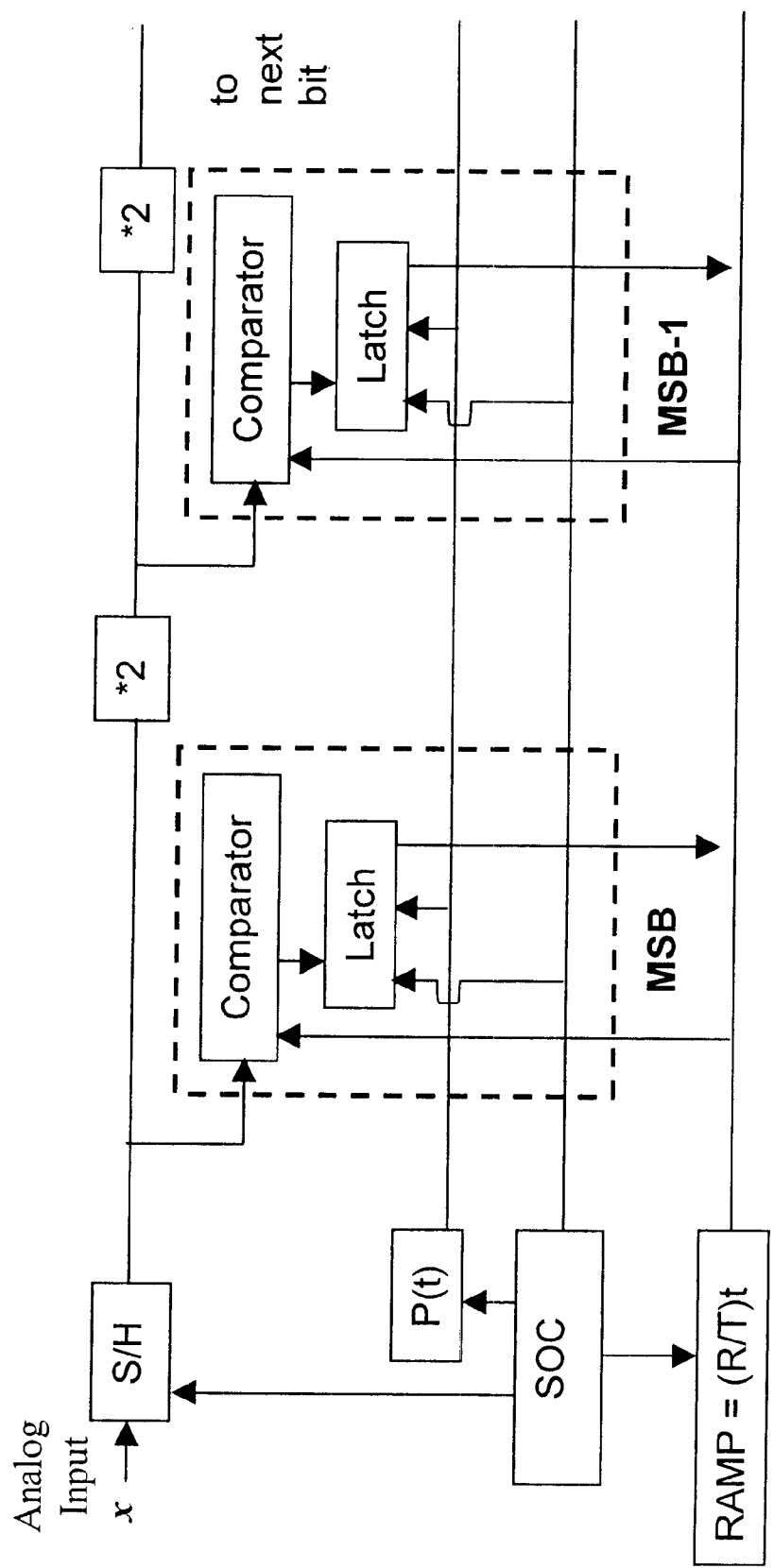
FIG. 9 depicts another alternative implementation using only one ramp generator, one pulse generator, and N modules, each module consisting of a latch, a comparator, and a doubler.

Another embodiment avoids the use of different multipliers in each module by using doublers. This scheme is depicted in FIG. 9. Here, the modules are arranged from MSB to LSB. The input signal to the MSB module is the analog sample x. The input signal to each module is obtained by multiplying the input to the previous one by 2; this is achieved by using a doubler. In this fashion, the input to the (MSB-1)th module is 2x, that to the (MSB-2)th module is 4x, and to the (MSB-i)th module is given by $2^i*x$. Doublers are more efficiently realized in hardware than different multiplers required by each module.

In an alternative embodiment obtained by modifying the design in FIG. 9, if each doubler also includes a delay, it is possible to obtain a pipelined implementation, where a sample is taken and input to the MSB block. Since subsequent blocks receive successively delayed and doubled versions of the same sample, previous blocks are free to take on newer samples, resulting in increased throughput.

Figure 10:
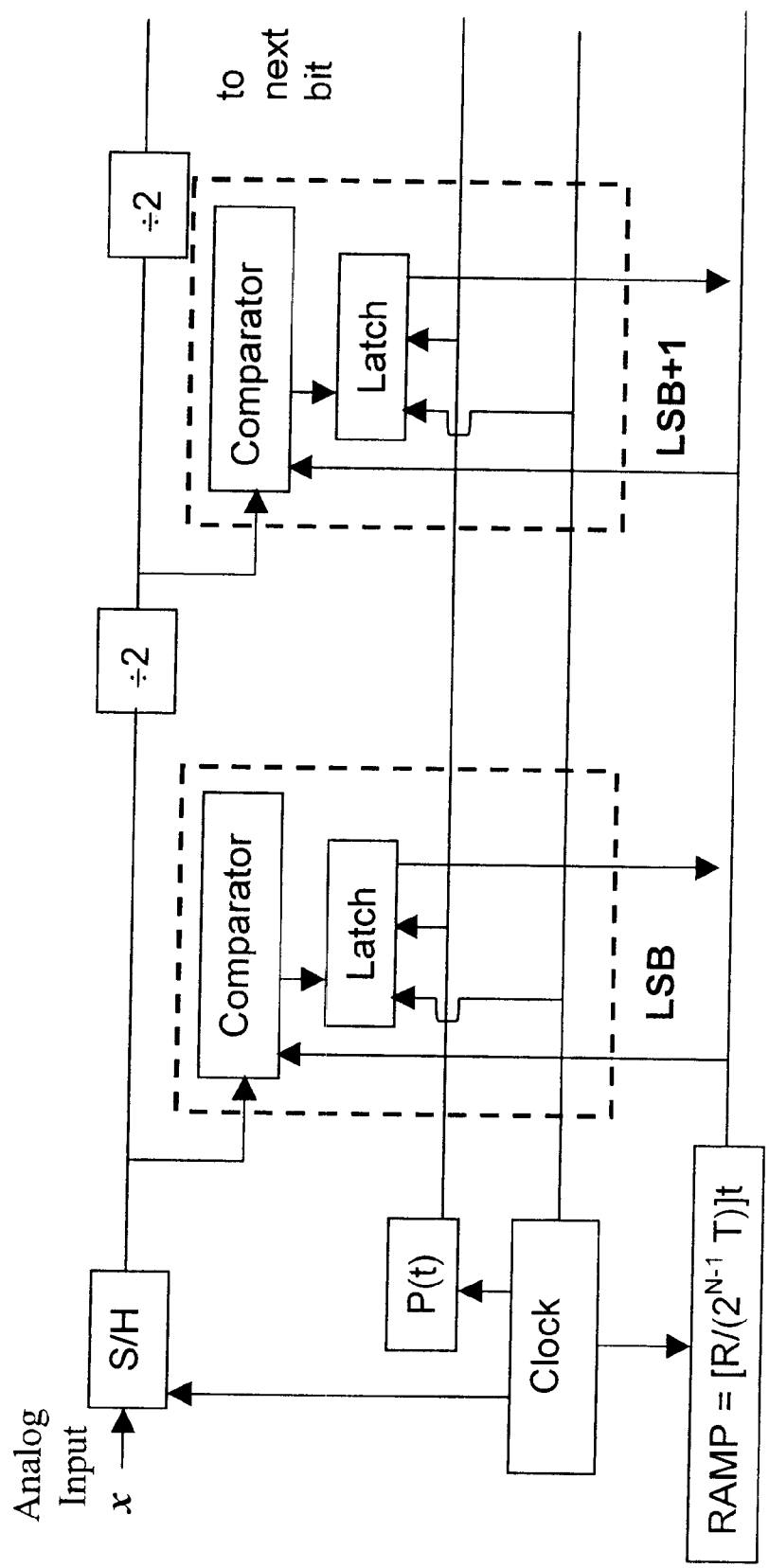
FIG. 10 depicts another alternative implementation using only one ramp generator, one pulse generator, and N modules, each module consisting of a latch, a comparator, and a divide-by-two unit.

Yet another embodiment to the scheme is shown in FIG. 10. In this design, the modules are arranged from the LSB to the MSB. All modules are supplied by a single pulse generator and only one ramp generator. The ramp generator's output is given by $[R/(2^{N-1}*T)]t$. The input signal to the LSB module is the analog sample x. The input signal to each module is obtained by dividing the input to the previous one by 2; this is achieved by using a halver or divide-by-two unit. In this fashion, the input to the (LSB+1)th module is x/2, that to the (LSB+2)th module is x/4, and to the (LSB+i)th module is given by $x/2^i$. Halvers are more efficiently realized in hardware than different multiplers required by each module. The comparator in the (LSB+i)-th block switches when the ramp and input values are equal. This happens at a time $t_i$, where $[R/(2^{N-1}*T)]t_i=x/2^i$, i.e. $t_i=x/[R/(2^{N-i-1}*T)]$. $P(t_i)$ is thus equal to $P\{x/[R/(2^{N-i-1}*T)]\}$, which is nothing but the value of the (LSB+i)-th bit given by the formula depicted in FIGS. 2 and 4. This value is held on to by the latch in the (LSB+i)-th bit block. Note that the MSB is LSB+(N-1); $P(t_i)$ is thus equal to $P[x/(R/T)]$, which is exactly the value given by the formula depicted in FIGS. 2 and 4. An added advantage of this scheme is that the ramp generator does not need to be a fast one. A combination of doublers and divide by two units can also be used. Several other alternative implementations of the pipelined version are possible.

The main advantage of the proposed scheme is that all the bits can be computed in parallel. The hardware required is much less than that of a flash converter. No decoding logic is required, as used in other known methods used conventionally. Moreover, as the hardware used is very simple, the working of the system is fast. Furthermore, the hardware in the proposed invention required grows linearly with the number of bits, i.e. a N-bit converter requires N blocks, each of a fixed size.

The schematic of the subject application is highly amenable to realization on a VLSI chip (integrated circuit). The scheme allows for many different implementations offering different degrees of tradeoff between speed and hardware requirement.

The subject application is a statement of invention, where several other alternative implementations of the pipelined version are possible as known to the person skilled in the art. Hence, the same should not be construed to restrict the scope of the invention.

What is claimed is:

1. Analog to digital converter computing all the bits in parallel or sequentially without using any decoding means having an analog input and a digital output, wherein the digital output is a binary word comprising the bits which are computed using the formula:

$$V_{MSB-i}=P[x/(R/2^i)], i=0, 1, 2, \ldots N-1$$

where $V_{MSB}$ denotes the Most Significant Bit, x is the analog input whose magnitude ranges from 0 to R, N is the number of bits in the output digital word, and P is a square wave form with period equal to 1.

2. Analog to digital converter computing all the bits sequentially without using any decoding means having an analog input and a digital output, comprising means for sampling the analog input signal and holding the sample values;

counter block initialized having the initial counter value at 1 counting from 1 to N multiplexer receiving the sample values from sample and holding means, wherein when the counter value is equal to 1, the multiplexer passes the input on line 1 to its output and the multiplexer passes the input on Line 2 to its output, when the counter value is any number other than 1 and the output from multiplexer is fed to a functional block as well as to a delay block (circuit);

delay mechanism connected to the output of multiplexer to delay the signal passed by multiplexer before being doubled;

doubler connected to the delay circuit and multiplexer, doubling the delayed signal to feed the doubled output signal to the multiplexer, wherein the multiplexer passes one of its inputs to the functional block depending upon the counter value;

functional block comprising a combination of non-linear gain blocks, realizing the formula of $V_{MSB}$.

3. Analog to digital converter computing all the bits in parallel or sequentially without using any decoding means having an analog input and a digital output, comprising a) means for sampling the analog input signal and holding the sample values b) a set of N modules arranged in parallel for determining each of the N bits of the digital output word, where N denotes the word length;

c) Each module comprising
   (i) ramp waveform generator whose output is given by $k_i t$, where $k_i$ is the slope of the ramp and t denotes time measured from the arrival of the Start of Conversion (SOC) pulse, and where $k_i$ is given by $[R/(T \times 2^i)]$ for the (MSB-i)-th bit or module, R denotes the range of the input signal x, i.e. x ranges from 0 to R, and where T denotes the conversion time, which is fixed depending on the application and the speed at which the converter is required to be operated (ii) pulse generator P(t) generating a square waveform with a constant time period T, where T refers to the above conversion time, which is fixed depending on the application and the speed at which the converter is required to be operated; the pulse waveform being zero for the first half period and equal to one for the second half of the time period (iii) comparator generating the end-of-conversion signal when the sampled value and output of the Ramp are equal, and supplying the same to the latch to store and hold the value of the pulse generator (iv) latch receiving and storing the output from pulse generator when the trigger output from comparator is at its rising edge, signaling the end of conversion of the input signal from analog to digital.

4. Analog to digital converter according to claim 3, wherein the converter comprises a plurality of circuits arranged in parallel for different bits.

5. Analog to digital converter according to claim 3, wherein all the circuits generating various bits from most significant to least significant bit are supplied by a single ramp generator and single pulse generator.

6. Analog to digital converter according to claim 3, wherein, wherein a halver is placed between every two adjacent modules dividing the input of the first module by a factor of 2, feeding the divided value as input to the second module.

7. Analog to digital converter according to claim 3, wherein a doubler is provided between every two adjacent modules.

* * * * *